United States Patent
Nakazawa

(10) Patent No.: US 6,333,888 B1
(45) Date of Patent: Dec. 25, 2001

(54) SEMICONDUCTOR MEMORY DEVICE

(75) Inventor: Shigeyuki Nakazawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/553,174

(22) Filed: Apr. 20, 2000

(30) Foreign Application Priority Data

Apr. 23, 1999 (JP) .................................................. 11-117223

(51) Int. Cl.$^7$ ..................................................... G11C 7/00
(52) U.S. Cl. ................... 365/230.03; 365/201; 365/222; 365/236; 365/230.06
(58) Field of Search ........................... 365/230.1, 230.03, 365/230.06, 201, 222, 236

(56) References Cited

U.S. PATENT DOCUMENTS

| | | | |
|---|---|---|---|
| 5,463,590 | * | 10/1995 | Watanabe ........................ 365/230.03 |
| 5,471,430 | * | 11/1995 | Sawada et al. ...................... 365/222 |
| 5,636,173 | * | 6/1997 | Schaefer .......................... 365/230.03 |
| 5,673,233 | * | 9/1997 | Wright et al. ........................ 365/233 |
| 5,777,942 | * | 7/1998 | Dosaka et al. .................... 365/230.03 |
| 6,049,502 | * | 4/2000 | Cowles et al. .................... 365/230.03 |
| 6,195,306 | * | 2/2001 | Horiguchi et al. ................... 365/226 |

FOREIGN PATENT DOCUMENTS

| | | | |
|---|---|---|---|
| 401171197A | * | 7/1989 | (JP) . |
| 402044595A | * | 2/1990 | (JP) . |
| 410074388A | * | 3/1998 | (JP) . |
| 10-92175 | | 4/1998 | (JP) . |

* cited by examiner

*Primary Examiner*—Viet Q. Nguyen
(74) *Attorney, Agent, or Firm*—Young & Thompson

(57) ABSTRACT

A semiconductor memory device capable of normally executing a refresh counter test with simplified circuit configurations and wiring is provided. According to the semiconductor memory device of the present invention, column decoders of all banks are activated, at a time of executing a refresh counter test, based on a write command or read command supplied after a refresh command has been supplied.

8 Claims, 13 Drawing Sheets

221; column decoder
41; NAND gate
42; inverter $EN_1$
$ICAD_n$
$SW_n$

231; row decoder
43; NAND gate
44; inverter $RCTL_1$
$IRAD_m$
$WD_m$

241; input/output controlling circuit
45; NAND gate
46 47 48 49; inverter $RCTL_1$
$EN_1$
PIO

SEMICONDUCTOR MEMORY DEVICE

BACKGROUND OF THE INVENTION

1. Field of the Invention

The present invention relates to a semiconductor memory device and more particularly to the semiconductor memory device having a memory cell array provided with a plurality of memory cells mounted in a matrix form and having a plurality of banks composed of circuits mounted around the memory cell array.

2. Description of the Related Art

As is well known, a DRAM (Dynamic Random Access Memory), one type of semiconductor memory device, is constructed of memory cell arrays in which memory cells each being composed of a MOS (Metal Oxide Semiconductor) transistor for switching (hereinafter referred to as a "switching transistor") and of a memory capacitor are arranged in a matrix form. The memory capacitor is adapted to store one-bit data showing a "0" or "1" state depending on whether an electric charge is accumulated or not therein. A source electrode of the switching transistor constituting the memory cell is connected to one electrode of the memory capacitor. A gate electrode of the switching transistor is connected to a word line installed in parallel to a row. A drain electrode of the switching transistor is connected to a bit line installed in parallel to a column.

For example, when data stored in a certain memory cell is read out, it is necessary to activate a corresponding word line, i.e., to turn ON the switching transistor constituting the memory cell by applying an "H" (high) level voltage through the word line. This enables a detection of a rise or drop in voltages occurring on a corresponding bit line caused by an electric charge accumulated in the memory capacitor and the reading of one-bit data showing a "0" or "1" state.

On another hand, when data composed of the "1" state is written in a memory cell, for example, the electrical charge is accumulated in the above memory capacitor by activating the corresponding word line, i.e., by applying the "H" level voltage to the word line to turn the switching transistor ON and, at a same time, after the memory capacitor is charged by applying the "H" level voltage to the corresponding bit line, the switching transistor is turned OFF by applying a "L" (low) level voltage to the word line. Though the electrical charge accumulated in the memory capacitor is borne once therein, due to a minimal amount of leakage current, it decreases gradually as time elapses and is lost. It is, therefore, necessary to perform an operation called a "refresh" in which, after the switching transistor is turned ON every certain period of time, the electric charge being stored but gradually decreasing in the memory capacitor is detected and the detected charge is amplified by a sense amplifier, and then the same memory capacitor is again charged.

If the DRAM has several megabit capabilities, one memory cell array is sufficient. However, if it has several tens of megabits to several gigabit capabilities, a number of memory cells becomes several tens of thousands to several tens of billions, which causes inconveniences of processing enormous numbers of word lines and bit lines, longer access time for writing or reading data in and from a desired memory cell, or the like. To avoid this problem, the DRAM is ordinarily provided with a plurality of memory cell arrays. A part of the memory cell combined with a circuit mounted around the memory cell is called a "bank". In the DRAM having a plurality of banks, the refreshing operation described above is performed using a counter called a "refresh counter" internally mounted by the following procedures. That is, in the DRAM having two banks, for example, a counter value of the refresh counter is renewed and two banks are alternately selected by least significant several bits. Then, in a selected bank, "H" level voltages are applied, in order, to a plurality of word lines based on the counter value and all switching transistors connected to the word lines are turned ON and, after the electric charge is produced by the switching transistors being in an ON state, the stored but gradually decreasing charge in the memory capacitor is amplified by the sense amplifier and the same memory capacitor is again charged.

In the above-described DRAM having the plurality of banks, a refresh counter test for checking whether the above refresh counter is operating normally or not is introduced as one of functions contained in specifications of the DRAM. In the refresh counter test, whether the refresh counter is operating normally or not is confirmed by writing, in order, specified data into each of the memory cells while data stored in all or a part of the memory cells is being refreshed, then by reading, in order, data written in each of the memory cells after completion of the refreshing operation and by checking if data written previously in each of the memory cells is correctly read. In this test, the ordinary refresh in which, as described above, the electric charge stored but gradually decreasing in the memory capacitor is amplified and then the same memory capacitor is again charged, is not used. The ordinary refresh is generally called "automatic refresh" or "self refresh" in which, once a command to execute the refreshing operation is entered from outside, the refreshing operation does not stop until the amplification of the charge stored but gradually decreasing in the memory capacitor is ended and until a stop command is executed.

In contrast, the refresh used in the refresh counter test is generally called a "CBR (Cas Before Ras) refresh", in which, every time the command to execute the refresh is entered from outside, the counter value of the refresh counter is sequentially incremented to execute the refreshing operation.

A brief explanation of the refresh counter test is given below by referring to FIG. 14 and by using, as an example, a synchronous DRAM which is provided with banks A and B and a supplied command in synchronization with a clock from a CPU (Central Processing Unit), memory control unit or a like mounted externally and operates based on the supplied command.

First, in response to a mode register set command MRS (see (2) in FIG. 14) entered from outside in synchronization with the clock CLK (see (1) in FIG. 14), contents stored in the mode register are changed to an operation code used to designate a refresh counter test mode obtained by decoding an address supplied from outside. A plurality of mode registers mounted around the bank is used to temporarily store a variety of information including a burst length showing a number of clocks in a burst mode to perform consecutive operations of writing and reading data the like operations and various operation codes used to designate the refresh counter test mode and the burst mode.

Next, in response to a refresh command REF (see (2) in FIG. 14) supplied from outside in synchronization with the clock CLK (see (1) in FIG. 14), the counter value of the refresh counter is renewed. If a least significant bit RCL (see (7) in FIG. 14) of the counter value is, for example, a value RCLB to be used for activating the bank B, a signal RASB (see (6) in FIG. 14) is produced, based on the value RCLB, which activates a row decoder mounted corresponding to the bank B for applying the "H" level signal to a specified word line of the bank B by decoding an external row address supplied from outside or an internal row address composed of the counter value of the refresh counter. Therefore, since the row decoder corresponding to the bank B is activated by the signal RASB, the "H" level voltage is applied to the word line of the bank B designated by the row address and the refreshing is performed on the memory cell connected to the word line.

Then, in order to write specified data in the bank which has already been refreshed, it is necessary to designate the bank into which data is to be written and to activate a column switch which is a switch used to connect the bit line installed corresponding to the bank with an input/output line, installed in parallel to the bit line, adapted to input and/or output data fed from the outside of the semiconductor memory device into or from the memory cell, i.e., to activate a column decoder for applying the "H" level voltage. The designation of the bank to be refreshed is performed by activating the row decoder corresponding to the bank A or B in accordance with a signal RASA or RASB (see (5) and (6) in FIG. 14) produced based on the least significant bit RCL of the counter value of the refresh counter mounted in the semiconductor memory device. On the other hand, the designation of the bank performed when data is written after being refreshed is ordinarily carried out by activating the column decoder corresponding to the bank A or B in accordance with a signal CASA or CASB produced based on the most significant several bits of the address fed from outside. In this case, however, since the counter value of the refresh counter cannot be recognized from outside, it is impossible to realize, from outside, which bank, A or B, has already been refreshed.

If there is, therefore, nonconformity between the bank (the bank B in the present case) designated based on the signal RASB (see (6) in FIG. 14) produced in accordance with the least significant bit RCL (the value RCLB in the present case) of the counter value of the refresh counter counted up by the refresh command and the bank (the bank A in the present case) designated based on the signal CASA (see (3) in FIG. 14) based on the most significant several bits of the address fed from outside together with the write command entered following the refresh command, it is impossible to write specified data into the bank which has already been refreshed. Such an inconvenience occurs at a time of reading data alike. When this type of event occurs, normal execution of the refresh counter test is impossible accordingly.

A semiconductor memory device designed to overcome this shortcoming is disclosed, for example, in Japanese Laid-open Patent Application No. Hei10-92175. FIG. 15 is a schematic block diagram showing electrical configurations of a signal generating circuit of a conventional semiconductor memory device disclosed in the above application. The signal generating circuit is chiefly composed of OR gates 1 and 2, inverters 3 and 4, a register 5, switches 6, 7 and 8 and flip-flops 9 and 10. The OR gate 1 is adapted to feed an output signal obtained by ORing a burst write command BWR, fed from outside, to write data in the burst mode with a burst read command BRD, fed from outside, to read data in a burst mode, to each of first input terminals $IN_1$ of the flip-flops 9 and 10. The OR gate 2 is adapted to feed an output signal obtained by ORing a burst stop command BST, fed from outside, to stop the burst mode with a burst length end command BLE, fed from outside, to instruct the burst mode to be automatically terminated after a length of the data for writing and reading has reached a predetermined burst length, to each of second input terminals $IN_2$ of the flip-flops 9 and 10.

The inverter 3 is operated to invert a test mode signal TM which is produced in accordance with a refresh counter test command supplied from outside and goes high during the execution of the refresh counter test and to feed an inverted test mode signal TM to a control terminal of the switch 7.

The switch 6 is turned ON/OFF in accordance with a refresh command REF supplied from outside and is adapted to feed the least significant bit RCL of the counter value of the refresh counter to the register 5. The register 5 is composed of two inverters and, after temporarily holding the least significant bit RCL of the counter value of the refresh counter fed through the switch 6, feeds it to an input terminal of the inverter 4. The inverter 4 is used to invert an output signal from the register 5 and to feed it to an input terminal of the switch 8. The switch 7 is turned ON/OFF in accordance with an output signal from the inverter 3 and feeds the most significant bit EAM of an address supplied from outside to each of the third input terminals $IN_3$ of the flip-flops 9 and 10. The switch 8 is turned ON/OFF in accordance with the test mode signal TM and feeds an output signal of the inverter 4 to each of third input terminals $IN_3$ of the flip-flops 9 and 10. The flip-flops 9 and 10, when activated by a signal fed to their third input terminals $IN_3$, are operated to output a signal CASA which changes from its "L" level to its "H" level in accordance with the output signal from the OR gate 1, i.e., the burst write command BWR or the burst read command BRD and a signal CASB which changes from its "H" level to its "L" level in accordance with the output signal from the OR gate 2, i.e., the burst stop command BST or burst length end command BLE.

Next, operations of the semiconductor memory device having configurations described above will be described below.

First, at a time of ordinary refreshing operation and at a time of writing or reading, since the test mode signal TM is not supplied, the switch 7 is turned ON and the switch 8 is turned OFF. This causes the most significant bit EAM of an address supplied from outside to be fed to each of third input terminals $IN_3$ of the flip-flops 9 and 10 and therefore the flip-flop 9 or 10 is activated in accordance with the most significant bit EAM of the address, and the signal CASA or CASB is outputted.

In contrast, at a time of executing the refresh counter test, since the test mode signal TM is supplied, the switch 8 is turned ON and the switch 7 is turned OFF. When the refresh command REF is supplied, the switch 6 is turned ON. Since the least significant bit RCL of the counter value of the refresh counter is fed through the switch 6, register 5, inverter 4 and switch 8 to each of the third input terminals $IN_3$ of the flip-flops 9 and 10, the flip-flop 9 or flip-flop 10 is activated in accordance with the least significant bit RCL of the counter value of the refresh counter and the signal CASA or CASB is outputted.

By configuring as above, at the time of executing the refresh counter test, since a signal to activate the column decoder as well as a signal to activate the row decoder is produced from the least significant bit RCL of the counter value of the refresh counter counted up in accordance with the refresh command REF, the bank designated for the refresh conforms, without fail, to the bank designated for writing or reading data after the refreshing operation is performed. This enables the normal execution of the refresh counter test.

However, the conventional semiconductor memory device provided with the function of the refresh counter test contained in its specifications has problems. That is, complicated signal generating circuits are required for providing the function for the refresh counter test, which occupies large areas on a chip of the conventional semiconductor memory device. Moreover, signal lines required to transmit the least significant bit RCL of the counter value of the refresh counter must be installed on an overall area of the chip. Thus, the chip area is reduced by the above complicated circuits, wiring or like, causing the impedance of high integration of the semiconductor memory device.

SUMMARY OF THE INVENTION

In view of the above, it is an object of the present invention to provide a semiconductor memory device capable of normally executing a refresh counter test with simplified circuit configurations and wiring.

According to a first aspect of the present invention, there is provided a semiconductor memory device including:

a plurality of banks, and wherein column decoders of all banks are activated, at a time of executing a refresh counter test, based on a write command or read command supplied after a refresh command has been supplied.

According to a second embodiment of the present invention, there is provided a semiconductor memory device including:

a plurality of word lines, a plurality of bit lines, a plurality of memory cells each being mounted in a matrix form at a point of intersection between the word line and bit line;

a plurality of input/output lines each being mounted corresponding to each of the bit lines used to input and output data fed from outside to a corresponding memory cell, memory cell arrays each having a plurality of column switches to connect a corresponding bit line to the corresponding input/output line;

row decoders to activate any one of the plurality of word lines;

a plurality of banks each having a column decoder to activate any one of the plurality of column switches;

a refresh counter to renew its counter value in accordance with the refresh command;

first controlling means for outputting a first controlling signal to activate any one of the row decoders of the plurality of banks based on renewed counter values every time the refresh command is supplied; and second controlling means for outputting a second controlling signal to activate column decoders of all banks based on the write command or read command supplied after the refresh command has been supplied.

In the foregoing, a preferable mode is one that wherein includes a third controlling means for outputting a third controlling signal used to activate any one of the column decoders of the plurality of banks based on an output obtained by ANDing the first controlling signal with the second controlling signal.

Also, a preferable mode is one wherein the memory cell array has a plurality of voltage clamping means for clamping a voltage of each of the input/output lines at a predetermined level and wherein the semiconductor memory device includes a fourth controlling means for outputting a fourth controlling signal used to activate each of a plurality of the voltage clamping means of banks to which the first controlling signal is not supplied.

Also, a preferable mode is one wherein the plurality of banks are mounted in a transverse direction, in a longitudinal direction or in both longitudinal and transverse directions.

Furthermore, a preferable mode is one wherein the semiconductor memory device is of a synchronous type in which a command, at least, is entered in synchronization with a clock.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
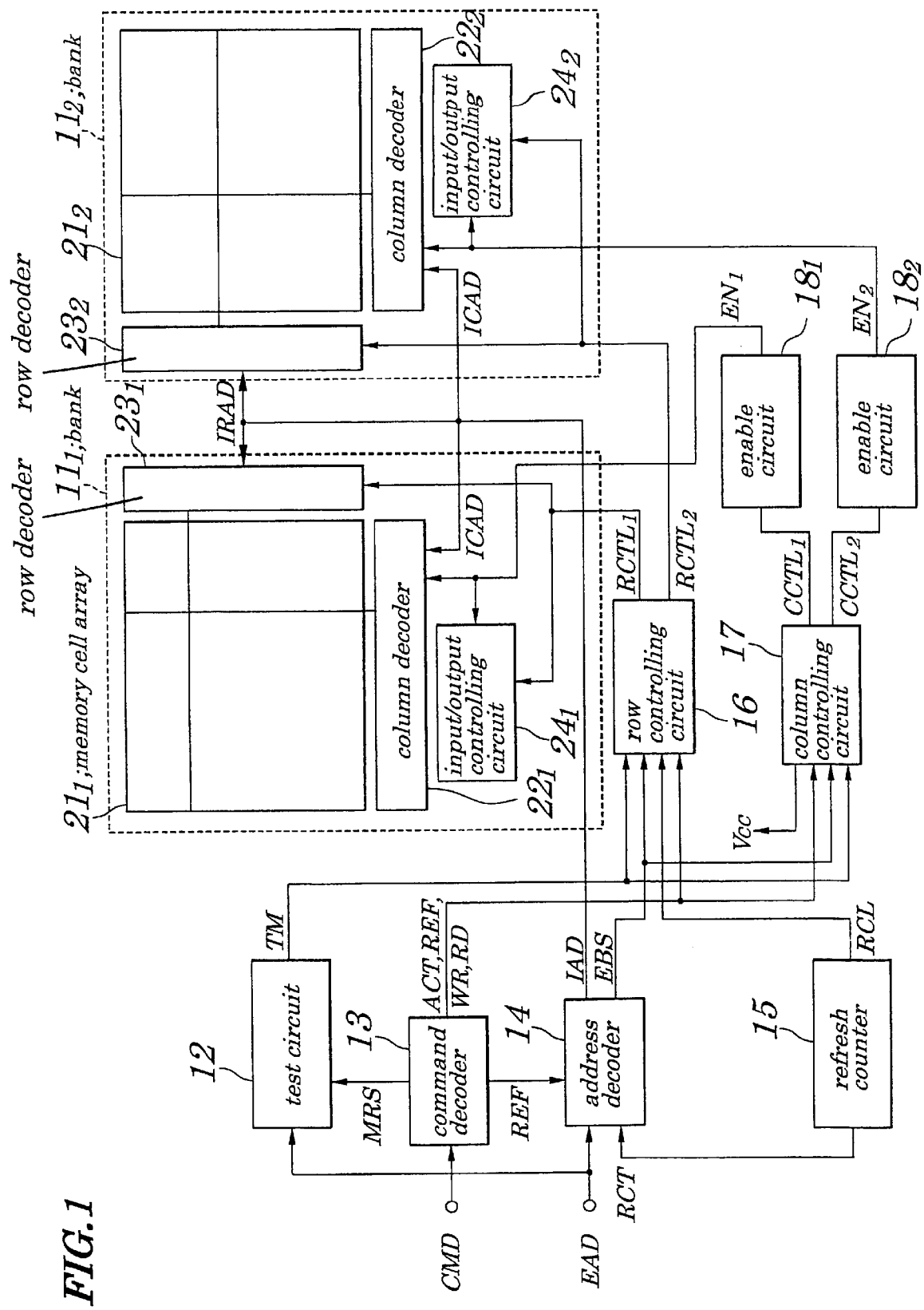
FIG. 1 is a schematic block diagram showing electrical configurations of a semiconductor memory device according to a first embodiment of the present invention.

FIG. 1 is a schematic block diagram showing electrical configurations of a semiconductor memory device according to a first embodiment of the present invention.

The semiconductor memory device of the first embodiment is a synchronous DRAM composed chiefly of banks $11_1$ and $11_2$, a test circuit 12, a command decoder 13, an address decoder 14, a refresh counter 15, a row controlling circuit 16, a column controlling circuit 17 and enable circuits $18_1$ and $18_2$. The banks $11_1$ and $11_2$ are functionally the same except that each of them has a different numerical subscript and that each of signals or data inputted or outputted has a differential numerical subscript, therefore the bank $11_1$ only is described. The bank $11_1$ is mainly composed of a memory cell array $21_1$, a column decoder $22_1$, a row decoder $23_1$ and an input/output controlling circuit $24_1$.

Figure 2:
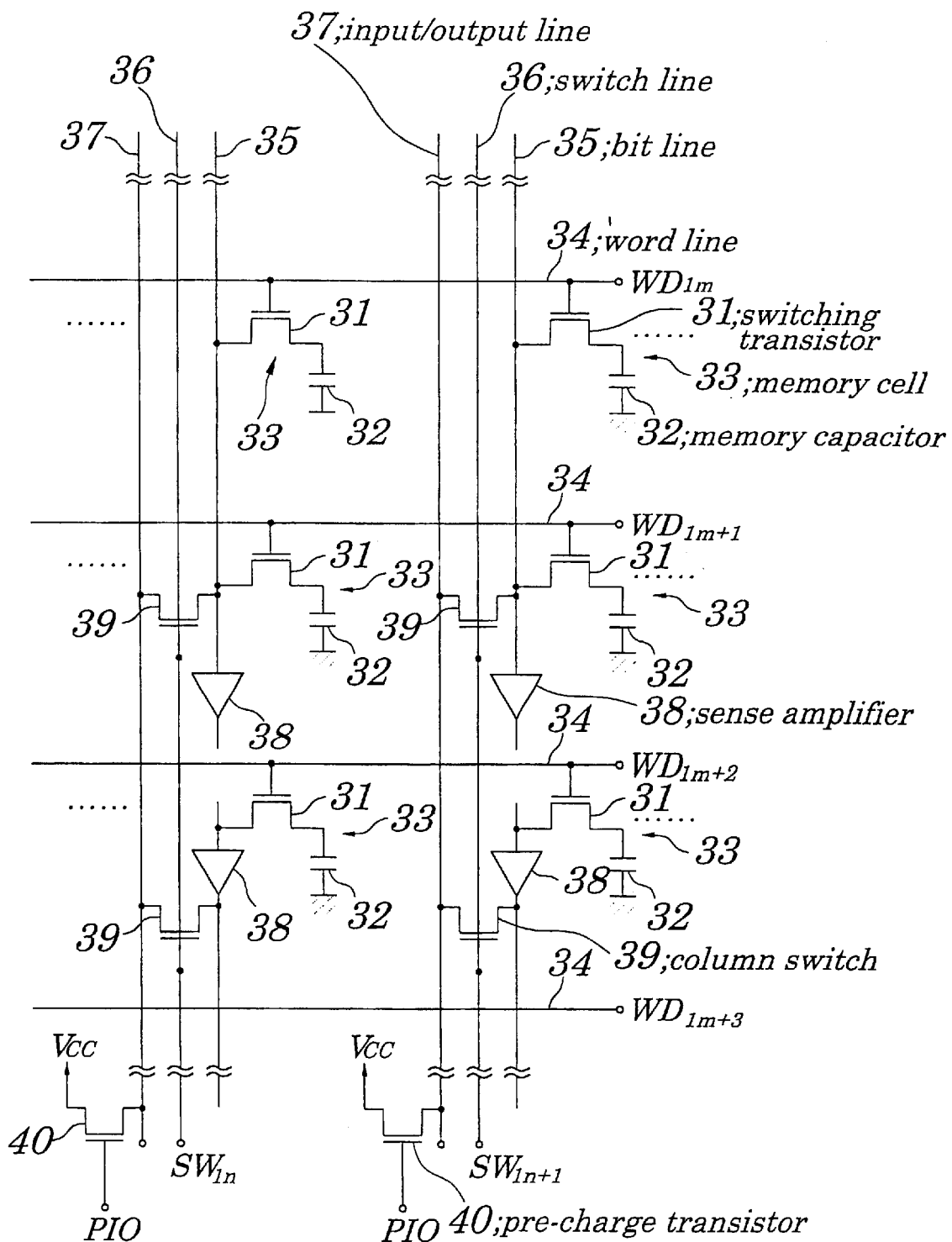
FIG. 2 is a schematic diagram showing one example of electrical configurations of a part of a memory cell array constituting the semiconductor memory device according to the first embodiment of the present invention.

FIG. 2 is a schematic diagram showing one example of electrical configurations of a part of the memory cell array $21_1$ constituting the semiconductor memory device. The memory cell array $21_1$ is chiefly composed of a plurality of memory cells 33, arranged in a matrix form, each having a switching transistor 31 and a memory capacitor 32, a plurality of word lines 34 installed in parallel to a row, a plurality of bit lines 35 installed in a parallel to column, switch lines 36 installed in parallel to the bit line 35, input/output lines 37 installed in parallel to the bit line 35 and the switch line 36, a plurality of sense amplifiers 38 installed, at least, at both ends of each bit line 35, column switches 39 each being composed of a MOS transistor and being installed between the bit line 35 and the input/output line 37 and a pre-charge transistor 40 each being composed of a MOS transistor and being installed at one end of each input/output line 37. A source electrode of the switching transistor 31 constituting each of the memory cells 33 is connected to one electrode of the memory capacitor 32. A gate electrode of the switching transistor 31 is connected to the word line 34 and its drain is connected to the bit line 35. Another electrode of the memory capacitor 32 is, for example, grounded. The word line 34, when activated by the row decoder $23_1$ (FIG. 1), i.e., when an "H" level word signal WD1m (m=1,2, ...) is fed thereto, is operated to turn ON the switching transistor 31, the gate electrode of which is connected to the word line 34.

Each of the word lines 34, switch lines 36 and input/output lines 37 is installed, in order, from an end to end within the memory cell array. For example, 512 memory cells mounted in a direction of a row are connected to each of the bit lines 35.

The column switch 39 is connected in a vicinity of the sense amplifier 38. A drain of the column switch 39 is connected to the input/output line 37, its gate electrode is connected to the switch line 36, and its source is connected to the bit line 35. The column switch 39, when activated by the column decoder $22_1$ (FIG. 1), i.e., when a "H" level switch signal SW1n (n=1,2, ...) is applied to the switch line 36, is operated to connect the bit line 35 to the input/output line 37, allowing writing of data from outside and reading of data to outside in a corresponding memory cell.

A supply power Vcc is applied to the drain electrode of the pre-charge transistor 40, its source is connected to the input/output line 37, and its gate is connected to the input/output controlling circuit $24_1$(FIG. 1). The pre-charge transistor 40, when activated by the input/output controlling circuit $24_1$, i.e., when a "H" level pre-charge input/output signal PIO is applied to its gate, is operated to apply a voltage being approximately equal to a supply voltage Vcc to the input/output line 37, disabling writing of data from outside and reading of data to outside in all memory cells mounted on corresponding input/output line 37.

On the other hand, the pre-charge transistor 40, while deactivated by the input/output controlling circuit $24_1$, i.e., when a "L" level pre-charge input/output signal PIO is being applied to its gate electrode, a corresponding input/output line is put in a pre-charged state, enabling writing of data from outside and reading of data to outside in the memory cell mounted corresponding to the input/output line 37.

Figure 3:
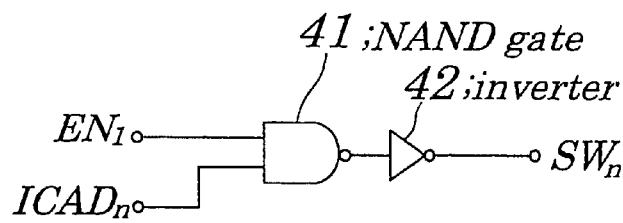
FIG. 3 is a schematic diagram showing one example of electrical configurations of a column decoder constituting the semiconductor memory device according to the first embodiment of the present invention.
Figure 4:
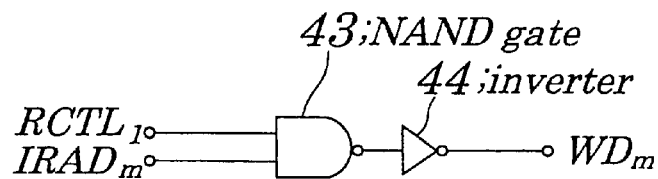
FIG. 4 a schematic diagram showing one example of electrical configurations of a row decoder constituting the semiconductor memory device according to the first embodiment of the present invention.
Figure 5:
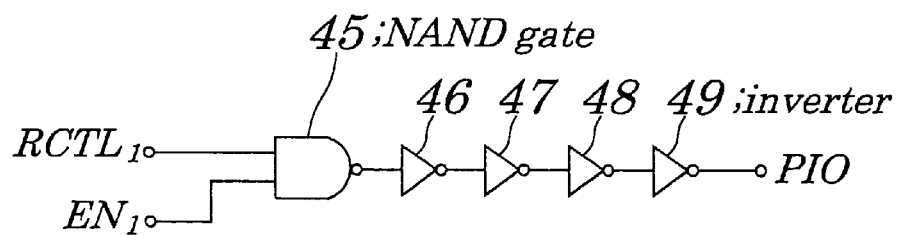
FIG. 5 is a schematic diagram showing one example of electrical configurations of an input/output controlling circuit constituting the semiconductor memory device according to the first embodiment of the present invention.

Referring to FIGS. 1, 2 and 3, in the column decoder $22_1$ of bank $11_1$, logic circuits each being composed of a NAND gate 41 and an inverter 42 are mounted corresponding to switch lines 36 in the memory cell array $21_1$, which are operated to supply an output, as the "H" level switch signal SW1n, obtained by ANDing an enabling signal $EN_1$ fed from the enable circuit $18_1$ with a bit ICADn (n=1,2, ...) corresponded by an internal column address ICAD out of an internal address IAD fed from the address decoder 14 and by inverting obtained output and then further once more inverting it to conform its timing to its logic, to the corresponding switch line 36. In the row decoder $23_1$ as shown in FIG. 4, logic circuits each being composed of a NAND gate 43 and an inverter 44 are mounted corresponding to word lines 34 in the memory cell array $21_1$, which are operated to supply an output, as the "H" level word signal WD1m, obtained by ANDing a row controlling signal $RCTL_1$ fed from the row controlling circuit 16 with a bit IRADm (m=1,2, ...) corresponded by an internal row address IRAD out of an internal address IAD fed from the address decoder 14 and by inverting obtained output and then further once more inverting it to conform its timing to its logic, to the corresponding switch line 36. The input/output controlling circuit $24_1$ as shown in FIG. 5, composed of a NAND gate 45 and inverters 46 to 49 are operated to supply an output, as a "L" level pre-charge input/output signal PIO, obtained by ANDing an enable signal $EN_1$ fed from the enable circuit $18_1$ with a row controlling signal $RCTL_1$ and by inverting the obtained output further four times, to the pre-charge transistor 40.

The test circuit 12 is composed of an address decoder and a plurality of mode registers and is operated, in accordance with a mode register set command MRS supplied from the command decoder 13, to convert stored contents of the mode register to an operation code used to designate various test modes including a refresh counter test mode or a like obtained by decoding an external address EAD supplied from external devices such as a CPU or memory controlling unit and, at the same time, to supply a test mode signal TM corresponding to the test mode to the row controlling circuit 16 and column controlling circuit 17. The command decoder 13 is operated to decode an external command CMD supplied in synchronization with a clock fed from outside, to supply an action command ACT used to activate each section, various commands including a refresh command REF, a write command WR, a read command RD or like to the row controlling circuit 16 and the column controlling circuit 17 and, at a same time, to feed the refresh command REF to the address decoder 14 and the mode register set command MRS to the test circuit 12.

The address decoder 14 is operated to decode an external address EAD supplied from outside into an internal address IAD and to feed it to the banks 11₁ and 11₂ and, at the same time, to supply the most significant 2 bits of the external address EAD to the row controlling circuit 16 as a bank selecting signal EBS from outside. Moreover, the address decoder 14, when the refresh command REF is fed from the command decoder 13, is adapted to supply a counter value fed from the refresh counter 15 to the banks 11₁ and 11₂ as the internal address IAD. A counter value RCT of the refresh counter 15 is renewed at the time of executing the refreshing and refresh counter test and the refresh counter 15 is adapted to supply the renewed counter value RCT to the address decoder 14 and its least significant 2 bits RCL to the row controlling circuit 16.

The row controlling circuit 16, in response to the bank selecting signal EBS fed from the address decoder 14, the least significant 2 bits RCL fed from the refresh counter 15, is adapted to produce row controlling signals RCTL₁ and RCTL₂ and to supply them to the row decoders 23₁ and 23₂ and input/output controlling circuits 24₁ and 24₂ respecitvely.

Figure 6:
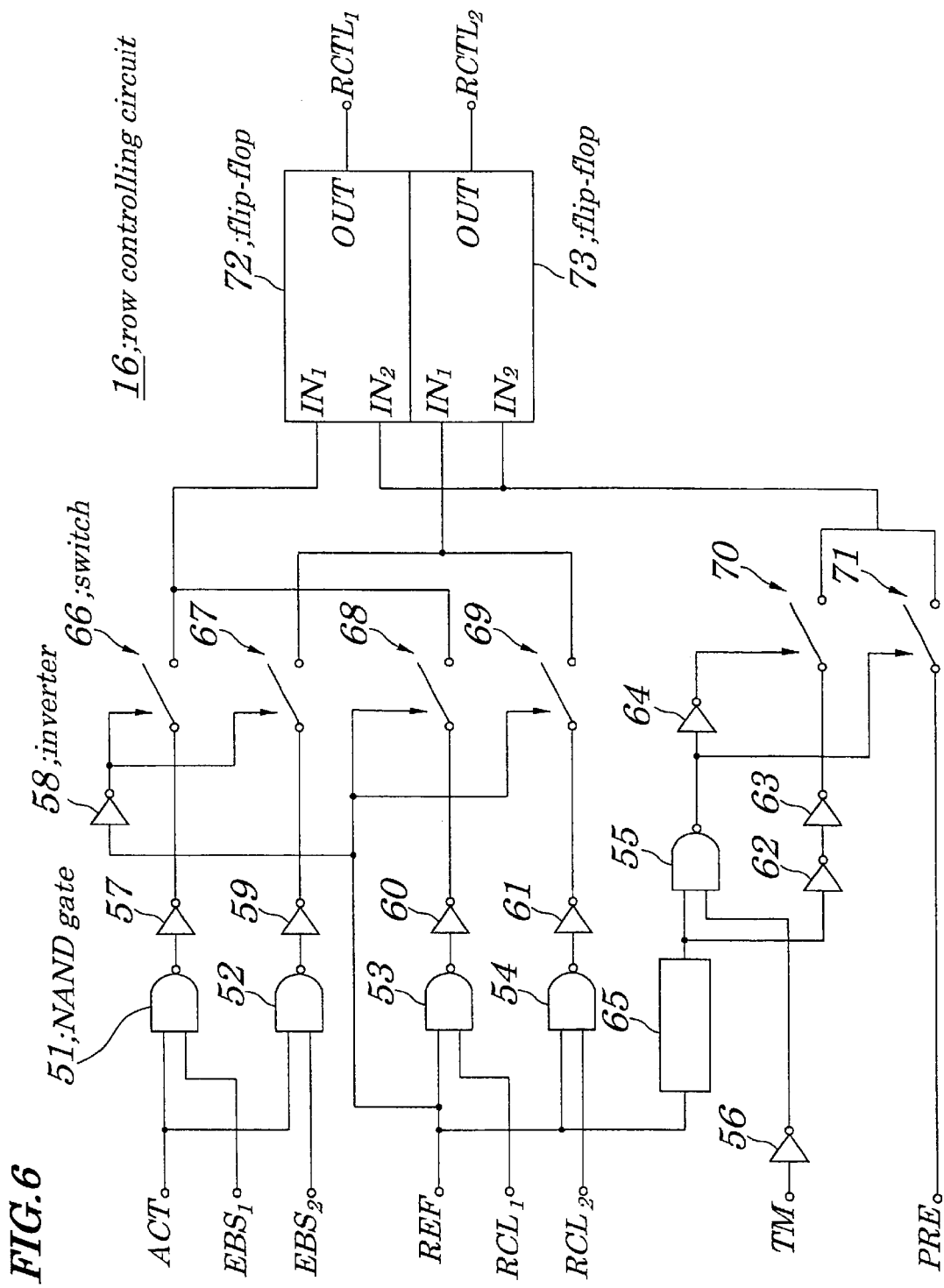
FIG. 6 is a schematic diagram showing one example of electrical configurations of a row controlling circuit constituting the semiconductor memory device according to the first embodiment of the present invention.

FIG. 6 is a schematic diagram showing one example of electrical configurations of the row controlling circuit 16 constituting the semiconductor memory device according to the first embodiment of the present invention. The row controlling circuit 16 is chiefly composed of NAND gates 51 to 55, inverters 56 to 64, a delay device 65, switches 66 to 71 and flip-flops 72 and 73. The NAND gate 51 is used to invert an output obtained by ANDing the action command ACT supplied from outside with bits EBS of the bank selecting signal EBS₁ supplied from the address decoder 14. The inverter 57 is used to invert the output signal from the NAND gate 51 and to feed it to an input terminal IN₁ of the switch 66. On the other hand, the inverter 58 is operated to invert the refresh command REF supplied from outside and to supply the inverted command to a control terminal of the switches 66 and 67. The switch 66 is turned ON/OFF in accordance with an output signal of the inverter 58 and operated to supply an output signal from the inverter 57 to the first input terminal of the flip-flop 72.

Figure 7:
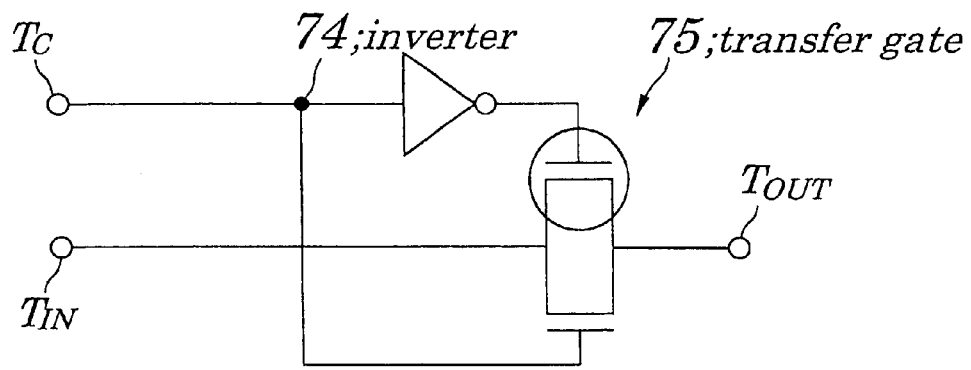
FIG. 7 is a schematic diagram showing one example of electrical configurations of a switch constituting the row controlling circuit in the semiconductor memory device according to the first embodiment of the present invention.
Figure 8:
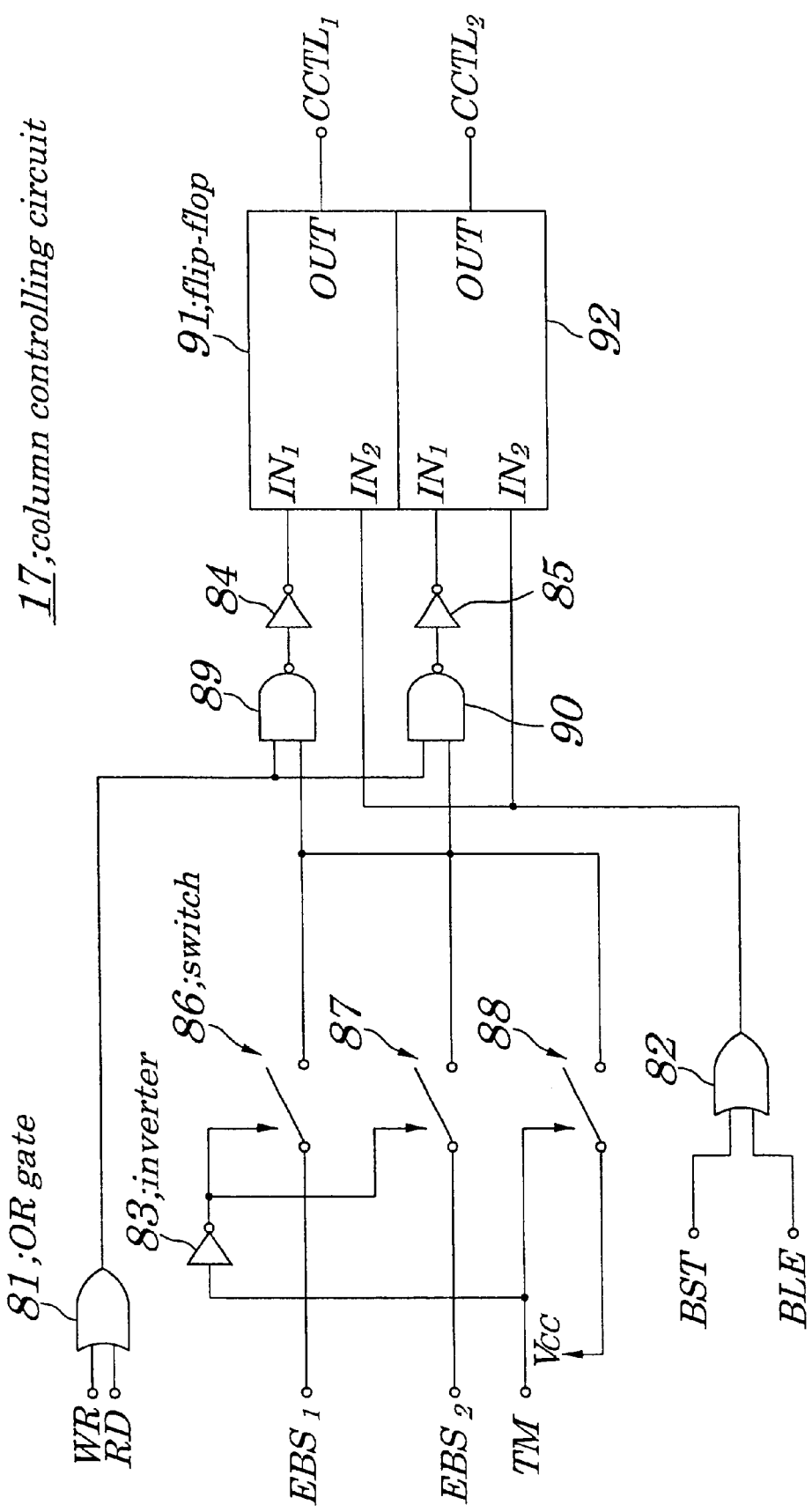
FIG. 8 is a schematic diagram showing one example of electrical configurations of a column controlling circuit constituting the semiconductor memory device according to the first embodiment of the present invention.

FIG. 7 is a schematic diagram showing one example of electrical configurations of a switch 66 constituting the row controlling circuit in the semiconductor memory device according to the first embodiment of the present invention. The switch 66 in FIG. 7 is composed of an inverter 74 and a transfer gate 75 having an N-channel MOS transistor and a P-channel MOS transistor, which are turned ON when its control terminal Tc receives an "H" level control signal and is adapted to output a signal inputted from an input terminal $T_{IN}$ to an output terminal $T_{OUT}$. Electrical configurations of other switches 67 to 71 and switches 86 to 88 in FIG. 8 are the same as those of the switch 66 in FIG. 7.

In FIG. 6, the NAND gate 52 is adapted to invert an output obtained by ANDing the action command ACT with bit ESB₂ of the bank selecting signal EBS and the inverter 59 is used to invert the output from the NAND gate 52 and to supply it to an input terminal of the switch 67. The switch 67 is turned ON/OFF in accordance with an output signal from the inverter 58, which is adapted to supply an output signal from the inverter 59 to the first input terminal of the flip-flop 73.

The NAND gate 53 is adapted to invert an output obtained by ANDing the refresh command REF with bit RCL₁ of the counter value RCL supplied from the refresh counter 15 and the inverter 60 is used to invert the output signal from the NAND gate 53 and to supply it to an input terminal of the switch 68. The switch 68 is turned ON/OFF in accordance with the refresh command REF and is adapted to supply an output signal from the inverter 60 to the first input terminal IN₁ of the flip-flop 72. The NAND gate 54 is adapted to invert an output obtained by ANDing the refresh command REF with bit RCL₂ of the counter value RCL and the inverter 61 is used to invert the output from the NAND gate 54 and to supply it to an input terminal of the switch 69. The switch 69 is turned ON/OFF in accordance with the refresh command REF and is adapted to supply an output signal from the inverter 61 to the first input terminal IN₁ of the flip-flop 73.

The delay device 65 operates to delay the refresh command REF by a predetermined time and then to supply it in the first input terminal of the NAND gate 55. In the case where the ordinary refresh operation is performed, unlike in the case where the refresh counter test is executed, the delay device 65 is used to produce a pseudo-command PRE because the pre-charge command PRE is not supplied. The inverter 56 is used to invert the test mode signal TM. The NAND gate 55 is used to invert an output obtained by ANDing the output signal from the delay device 65 with the output signal from the inverter 56 and to supply the signal to the inverter 64. The inverter 64 is used to invert the output signal from the NAND gate 55 and to feed the inverted signal to a control terminal of the switch 70. The inverter 62 is used to invert the output signal from the delay device 65 and to feed it to the inverter 63. The inverter 63 is used to invert the output signal from the inverter 62 and to feed it to an input terminal of the switch 70. The switch 70 is turned ON/OFF in accordance with the output signal from the inverter 64 and is used to supply the output signal from the inverter 63 to each of the second input terminals IN₂ of the flip-flops 72 and 73. The switch 71 is turned ON/OFF in accordance with the output signal from the NAND gate and is used to supply the pre-charge command PRE to the second input terminals IN₂ of the flip-flops 72 and 73. The flip-flop 72 is adapted to produce and output a row controlling signal RCTL₁ which changes from its "L" level to its "H" level in accordance with the output signal from the switch 66 or 68 and which changes from its "H" level to its "L" level in accordance with the output signal from the switch 70 or 71. The flip-flop 73 is adapted to produce and to output a row controlling signal RCTL₂ which changes from its "L" level to its "H" level in accordance with the output signal from the switch 67 or 69 and which changes from its "H" level to its "L" level in accordance with the output signal from the switch 70 or 71.

The column controlling circuit 17 shown in FIG. 1, in accordance with the bank selecting signal EBS supplied from the address decoder 14, the write command WR supplied from the command decoder 13 (FIG. 1) or a like, is operated to produce column controlling signals CCTL₁ and CCTL₂ (FIG. 8) and to feed them to enable circuits 18₁ and 18₂.

FIG. 8 is a schematic diagram showing one example of electrical configurations of the column controlling circuit 17 constituting the semiconductor memory device according to the first embodiment of the present invention. The column controlling circuit 17 is chiefly composed of OR gates 81 and 82, inverters 83, 84 and 85, switches 86, 87 and 88, NAND gates 89 and 90, and flip-flops 91 and 92. The OR gate 81 is operated to feed an output obtained by ORing the write command WR supplied from the command decoder 13 (FIG. 1) with the read command RD to the first input terminal of each of the NAND gates 89 and 90. The bit $EBS_1$ of the bank selecting signal EBS is fed to an input terminal of the switch 86 and the bit $EBS_2$ of the bank selecting signal EBS is fed to an input terminal of the switch 87. The inverter 83 is used to invert the test mode signal TM supplied from the test circuit 12 (FIG. 1) and to feed it to each of control terminals of the switches 86 and 87.

The switch 86 is turned ON/OFF in accordance with the inverter 83 and is operated to feed the bit $EBS_1$ of the bank selecting signal EBS to the second input terminal of the NAND gate 89, and the switch 87 is turned ON/OFF in accordance with the inverter 83 and is operated to feed the bit $EBS_2$ of the bank selecting signal EBS to the second input terminal of the NAND gate 90.

The switch 88 is turned ON/OFF in accordance with the test mode signal TM and is operated to feed a supply power Vcc applied to its input terminal to each of the second input terminals of the NAND gates 89 and 90. The OR gate 82 is operated to feed an output obtained by ORing a burst stop command BST supplied from the command decoder 13 (FIG. 1) and used to stop a burst mode with a burst length end command BLE used to stop the burst mode after a length of data for writing or reading reaches a predetermined burst length, to each of the second input terminals of the flip-flops 91 and 92.

The NAND gate 89 is operated to invert an output obtained by ANDing an output signal of the OR gate 81 with a signal supplied through the switches 86, 87 and 88, and the inverter 84 is used to invert the output signal from the NAND gate 89 and to supply it to the first input terminal $IN_1$ of the flip-flop 91. The NAND gate 90 is operated to invert an output obtained by ANDing an output signal from the OR gate 81 with a signal supplied through the switches 86, 87 and 88 and the inverter 85 is used to invert the output signal from the NAND gate 90 and feed it to the first input terminal $IN_1$ of the flip-flop 92. The flip-flop 91 is adapted to produce and output a column controlling signal $CCTL_1$ which changes from its "L" level to its "H" level in accordance with the output signal from the inverter 84 and which changes from its "H" level to its "L" level in accordance with the output signal from the OR gate 82. The flip-flop 92 is adapted to produce and output a column controlling signal $CCTL_2$ which changes from its "L" level to its "H" level in accordance with the output signal from the inverter 85 and which changes from its "H" level to its "L" level in accordance with the output signal from the OR gate 82.

Figure 9:
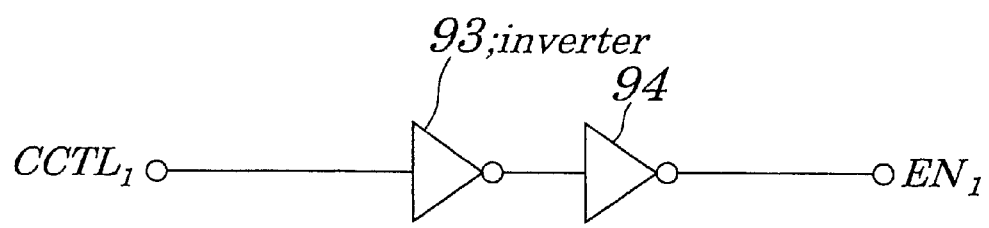
FIG. 9 is a schematic diagram showing one example of electrical configurations of an enable circuit constituting the semiconductor memory device according to the first embodiment of the present invention.

Referring to FIGS. 1 and 9, the enable circuit $18_1$ is composed of inverters 93 and 94 adapted to invert twice the column controlling signal $CCTL_1$ supplied from the column controlling circuit 17 to make its timing conformed to its logic and to feed, as an enable signal $EN_1$, to the column decoder $22_1$ and input/output controlling circuit $24_1$. Moreover, the configurations of the enable circuit $18_2$ are the same as those of the enable circuit $18_1$ except numerical subscripts of signals to be inputted and descriptions of them are omitted accordingly.

Figure 10:
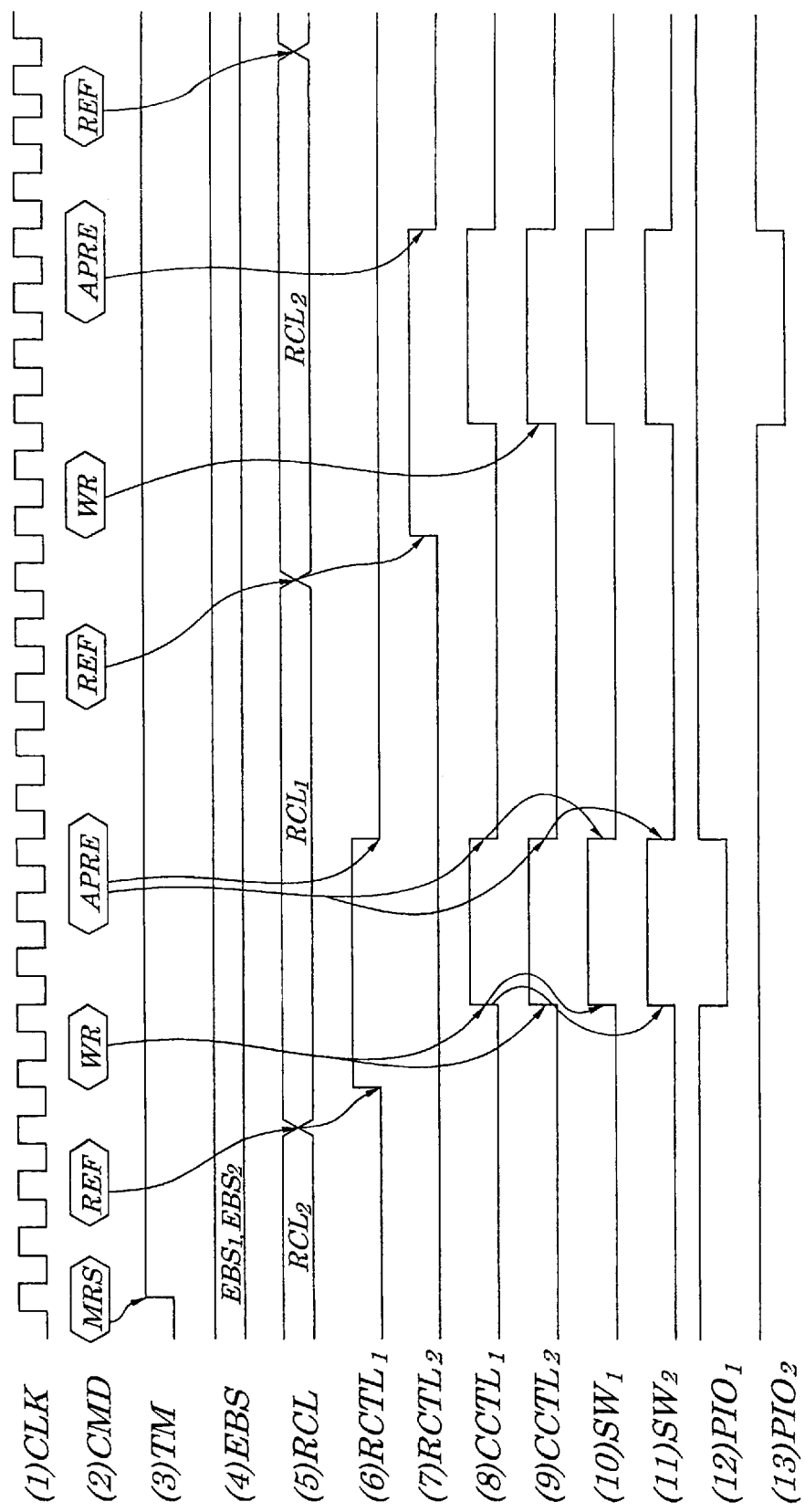
FIG. 10 is a timing chart briefly explaining a refresh counter test to be executed in the semiconductor memory device according to the first embodiment.

Next, a brief explanation of a refresh counter test executed in the semiconductor memory device having configurations described above is given by referring to a timing chart shown in FIG. 10.

First, the command decoder 13 operates to decode an external command CMD (see (2) in FIG. 10) supplied from outside in synchronization with a clock CLK (see (1) in FIG. 10) and, if the command is a mode register set command MRS, to feed it to the test circuit 12. The test circuit 12, in response to the mode register set command MRS supplied from the command decoder 13, operates to convert stored contents of the mode register to an operation code to designate a refresh counter test mode obtained by decoding an external address EAD supplied from outside and, at a same time, to feed a test mode signal TM (see (3) in FIG. 10) corresponding to the refresh counter test mode to the row controlling circuit 16 and the column controlling circuit 17. This causes an output signal from the NAND gate 55 of the row controlling circuit 16 to go high, in response to the test mode signal TM and regardless of a supply of the refresh command REF, which turns the switch 71 ON and the switch 70 OFF as a result (refer to FIG. 6). That is, this puts the row controlling circuit 16 into a state where, if a pre-charge command PRE is supplied, row controlling signals $RCTL_1$ and $RCTL_2$ can be changed from their "H" level to "L" level.

Since, in the column controlling circuit 17, in accordance with the test mode signal TM, the switch 88 is turned ON and the switches 86 and 87 are turned OFF (see FIG. 8), even if the address decoder 14 supplies the most significant 2 bits of an external address EAD supplied from outside to the column controlling circuit 17 as a bank selecting signal EBS (see (4) in FIG. 10), regardless of its value, a "H" level voltage is applied to each of second input terminals of the NAND gates 89 and 90. Therefore, when the operation is in the refresh counter test mode, as described later, the column controlling circuit 17 is operated, regardless of the value of the bank selecting signal EBS, to produce the column controlling signals $CCTL_1$ and $CCTL_2$.

The command decoder 13 is used to decode an external command CMD (see (2) in FIG. 10) supplied from outside in synchronization with the clock CLK (see (1) in FIG. 10) and if the command is the refresh command REF, to feed it to the address decoder 14 and the row controlling circuit 16. The address decoder 14 is operated to feed, in response to the refresh command REF supplied from the command decoder 13, a counter value RCT supplied from the refresh counter 15, as an internal address IAD, to banks $11_1$ and $11_2$.

On the other hand, since, in the row controlling circuit 16, in response to the refresh command REF supplied from the command decoder 13, the switches 68 and 69 are turned ON and the switches 66 and 67 are turned OFF (see FIG. 6), even if the address decoder 14 supplies the bank selecting signal EBS (see (4) in FIG. 10) to the row controlling circuit 16, regardless of its value, row controlling signals $RCTL_1$ and $RCTL_2$ are produced in accordance with bits $RCL_1$ and $RCL_2$ of the counter value RCL supplied from the refresh counter 15. In this case, since the bit $RCL_1$ of the counter value RCL is supplied from the refresh counter 15 as shown in (5) of FIG. 10, the row controlling signal $RCL_1$ goes high as shown in (6) of FIG. 10. This "H" level row controlling signal $RCTL_1$ is supplied to the row decoder $23_1$ and the input/output controlling circuit $24_1$.

Therefore, since the row decoder $23_1$ is activated by the "H" level row controlling signal $RCTL_1$, a "H" level voltage is applied by the row decoder $23_1$ to the word line 34 of the memory cell array $11_1$ designated by an internal address IAD and the memory cell 33 connected to this word line 34 is refreshed. The refreshing operations of this embodiment are the same as those of the conventional device and descriptions of them are omitted accordingly.

The command decoder 13 is used to decode an external command CMD (see (2) in FIG. 10) supplied from outside in synchronization with the clock CLK (see (1) in FIG. 10) and if the command is the write command WR, to feed it to the column controlling circuit 17. As described, at this point, the switch 88 of the column controlling switch 17 has already been turned ON and a "H" level voltage has been applied to each of second input terminals of the NAND gates 89 and 90. Therefore, by the supply of the write command WR, column controlling signals $CCTL_1$ and $CCTL_2$ outputted from the flip-flops 91 and 92 go high simultaneously (see (8) and (9) in FIG. 10) and each of them is supplied to enable circuits $18_1$ and $18_2$ respectively. Thus, the "H" level column controlling signals $CCTL_1$ and $CCTL_2$, when passing through enable circuits $18_1$ and $18_2$ become enable signals $EN_1$ and $EN_2$ respectively, which are fed to the column decoders $22_1$ and $22_2$ and input/output controlling circuit $24_1$ and $24_2$. Since the column decoders $22_1$ and $22_2$ are activated by the supply of the "H" level enable signals $EN_1$ and $EN_2$, "H" level switch signals $SW_1$ and $SW_2$ are applied by the column decoder $22_1$ to the switch line 36 of the memory cell arrays $11_1$ and $11_2$ designated by the internal address IAD, and the bit line 35 installed in parallel to the switch line 36 and input/output line 37 are connected. On the other hand, since, in the input/output controlling circuit $24_1$, both the "H" level column controlling signal $CCTL_1$ and the enable signal $EN_1$ are supplied, though a "L" level pre-charge input/output signal $PIO_1$ is outputted (see (12) in FIG. 10), in the input/output controlling circuit $24_2$, only the "H" level enable signal $EN_2$ is fed, the column controlling signal $CCTL_2$ remains in the "L" level and the pre-charge input/output signal $PIO_2$ remains in the "H" level (see (13) in FIG. 10).

Therefore, in the memory cell array 211, data supplied from outside is written on a desired memory cell through the selected input/output line 37, column switch 39 and bit line 35. In contrast, in the memory cell array $21_2$, since a voltage being approximately equal to the supply voltage Vcc remains applied to the input/output line 37, even when data is supplied from outside, no data is written on the memory cell.

Moreover, in the conventional DRAM having a plurality of banks, an address field of each bank is ordinarily different and, in the bank in which an address supplied to activate the row decoder 23 is different from that to activate the column decoder 22, i.e., which is not activated by the row controlling signal RCTL, a path from an input terminal of the column controlling signal CCTL to the column switch is deactivated and the sense amplifier 38 or the like is not activated as well. Therefore, in the refresh counter test of this embodiment, though it is not always necessary to apply a voltage being approximately equal to the supply voltage Vcc by the input/output controlling circuit 24, pre-charge transistor 40 or the like to the input/output line 37, to ensure safety, these circuits are mounted.

The command decoder 13 is operated to decode the external command CMD (see (2) in FIG. 10) supplied from outside in synchronization with the clock CLK (see (1) in FIG. 10) and, if the command is an all-pre-charge command APRE to put all banks into a pre-charge state, the pre-charge command PRE is supplied to the row controlling circuit 16 and the burst stop command BST is supplied to the column controlling circuit 17. As described above, since the switch 71 of the row controlling circuit 16 has been turned ON in response to the test mode signal TM, by the supply of the pre-charge command PRE, the "H" level row controlling signal $RCTL_1$ being outputted from the flip-flop 72 becomes low (see (6) in FIG. 10). On the other hand, in the column controlling circuit 17, by the supply of the burst stop command BST, the "H" level column controlling signals $CCTL_1$ and $CCTL_2$ become low simultaneously (see (8) and (9) in FIG. 10), and each of them is supplied to the enable circuit $18_1$ and $18_2$. By the simultaneous change of the column controlling signal $CCTL_1$ and $CCTL_2$ from their "H" level to their "L" level, the enable signal $EN_1$ and $EN_2$ change from their "H" to "L" level at a same time and, therefore, the switch signals $SW_1$ and $SW_2$ change from their "H" to "L" level (see (10) and (11) in FIG. 10) and, at the same time, the pre-charge input/output signal $PIO_1$ changes from its "L" to "H" level (see (12) in FIG. 10).

The operations of the refreshing and writing of data in the bank $11_1$ at the time of executing the refresh counter test have been described above. Operations of refreshing and writing of data in the bank $11_2$ (refer to the second half of the timing chart in FIG. 10), of refreshing and reading of data in the bank $11_1$, and of refreshing and reading of data in the bank $11_2$ are the same as those described above and descriptions of them are omitted accordingly.

According to the configurations of this embodiment, at the time of executing the refresh counter test, regardless of the value of the bank selecting signal EBS supplied from the address decoder 14, since the column switches 39 of the both bank $11_1$ and $11_2$ are turned ON and, at a same time, the voltage of the input/output line 37 of a bank being not activated is kept at the voltage being approximately equal to the supply voltage Vcc, unlike in the case of the conventional semiconductor memory device, it is not necessary to mount the complicated signal generating circuit and to install signal lines required to transmit the least significant two bits RCL of the counter value of the refresh counter on the overall chip.

Thus, with simplified circuit configurations and wiring, it is possible to normally execute the refresh counter test.

Second Embodiment

Figure 11:
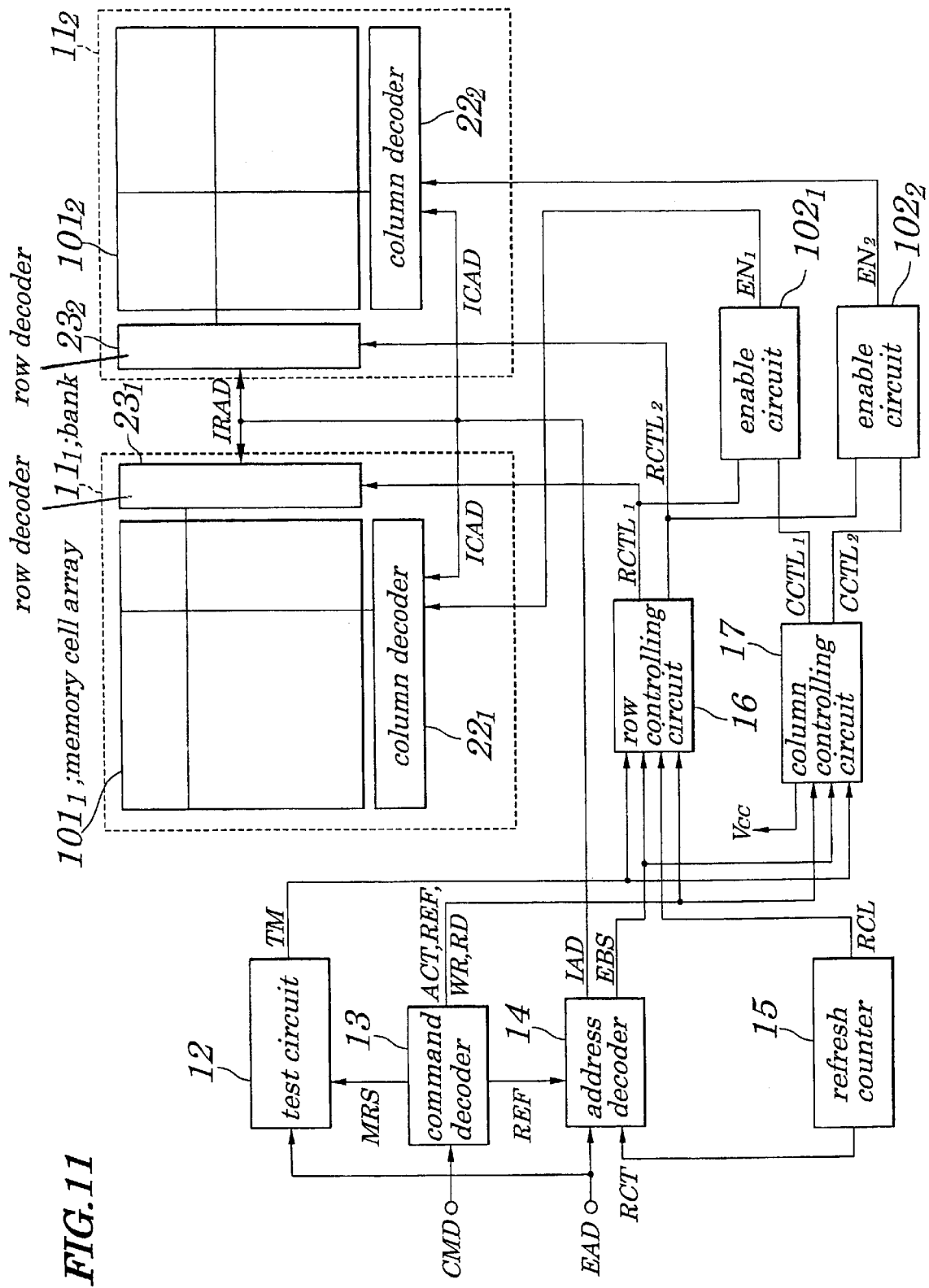
FIG. 11 is a schematic block diagram showing electrical configurations of a semiconductor memory device according to a second embodiment of the present invention.

FIG. 11 is a schematic block diagram showing electrical configurations of a semiconductor memory device according to a second embodiment of the present invention. The same reference numbers in FIG. 11 designate corresponding parts in FIG. 1 and descriptions of them will be omitted. In the semiconductor memory device shown in FIG. 11, instead of the memory cell arrays $21_1$ and $21_2$ and the enable circuits $18_1$ and $18_2$ shown in FIG. 1, memory cell arrays $101_1$ and $101_2$ and enable circuits $102_1$ and $102_2$ are newly mounted, while the input/output controlling circuits $24_1$ and $24_2$ shown in FIG. 1 are removed.

Memory cell arrays $101_1$ and $101_2$ in FIG. 11 differ from the memory cell arrays $21_1$ and $21_2$ in that a pre-charge transistor 40 (FIG. 2) contained in the memory cell arrays $101_1$ and $101_2$ is not included in the memory cell $21_1$ and $21_2$.

Figure 12:
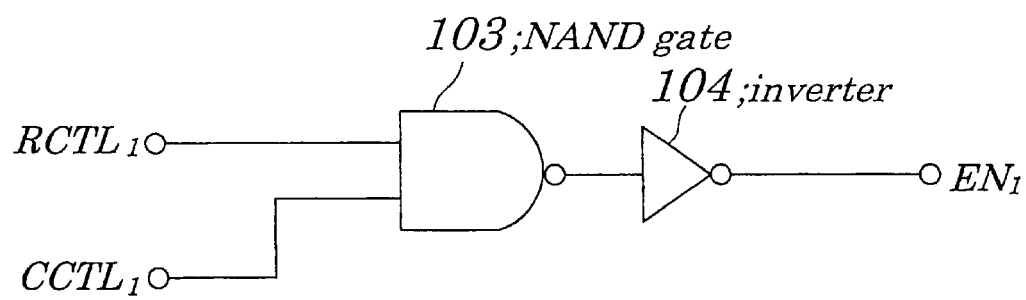
FIG. 12 is a schematic diagram showing one example of electrical configurations of an enable circuit constituting the semiconductor memory device according to the second embodiment of the present invention.

The enable circuit $102_1$ shown in FIG. 12 is composed of a NAND gate 103 and an inverter 104 is operated to invert an output obtained by ANDing a row controlling signal $RCTL_1$ with a column controlling signal $CCTL_1$ and then further by inverting the inverted signal to make its timing conformed to its logic and to feed, as an enable signal $EN_1$, to the column decoder $22_1$. Moreover, configurations of the enable circuit $102_2$ are the same as those of the enable circuit $102_1$ except numerical subscripts for inputted and outputted signals and descriptions of them are omitted accordingly.

Figure 13:
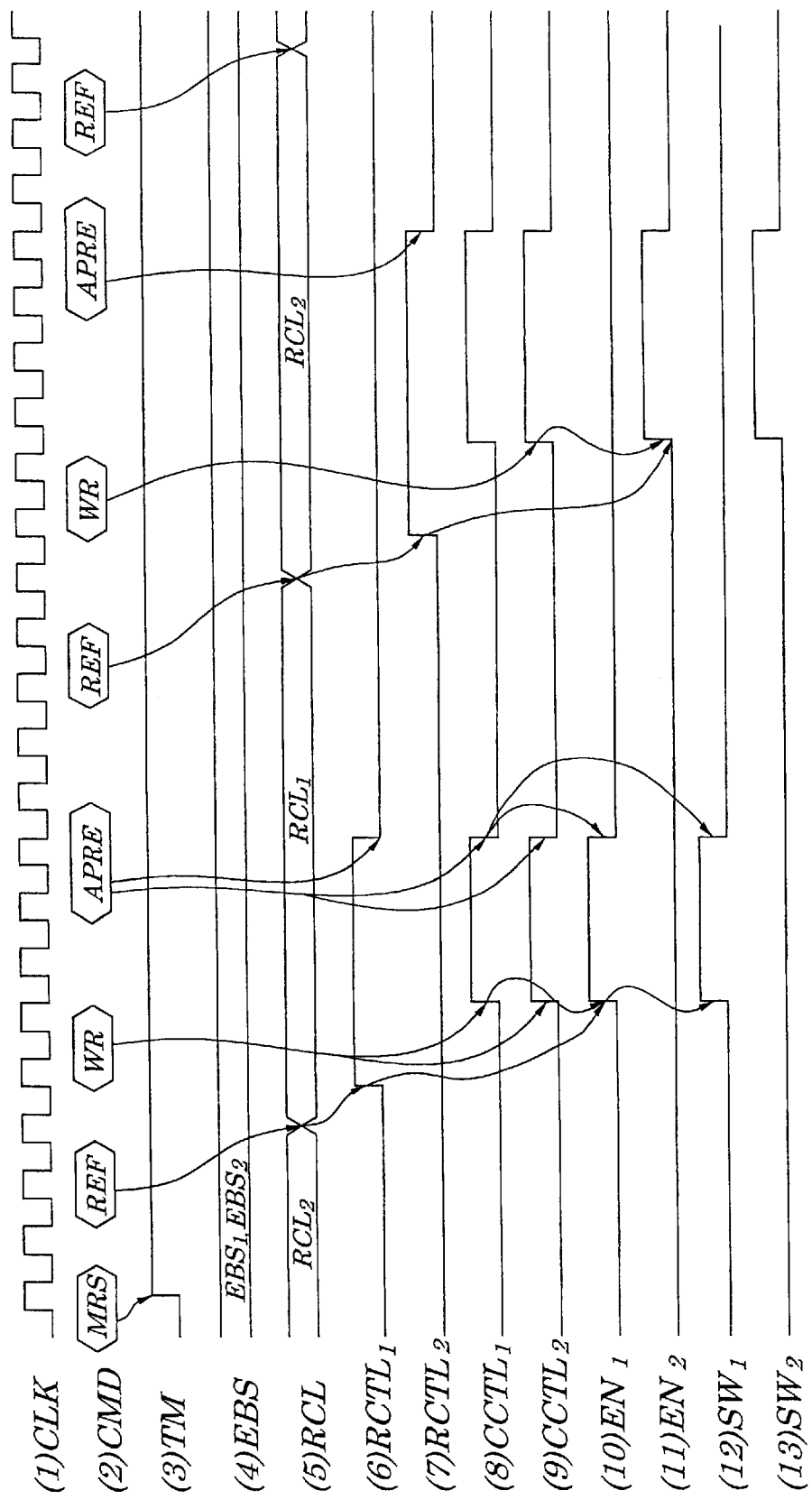
FIG. 13 is a timing chart briefly explaining a refresh counter test to be executed in the semiconductor memory device according to the second embodiment.
Figure 14:
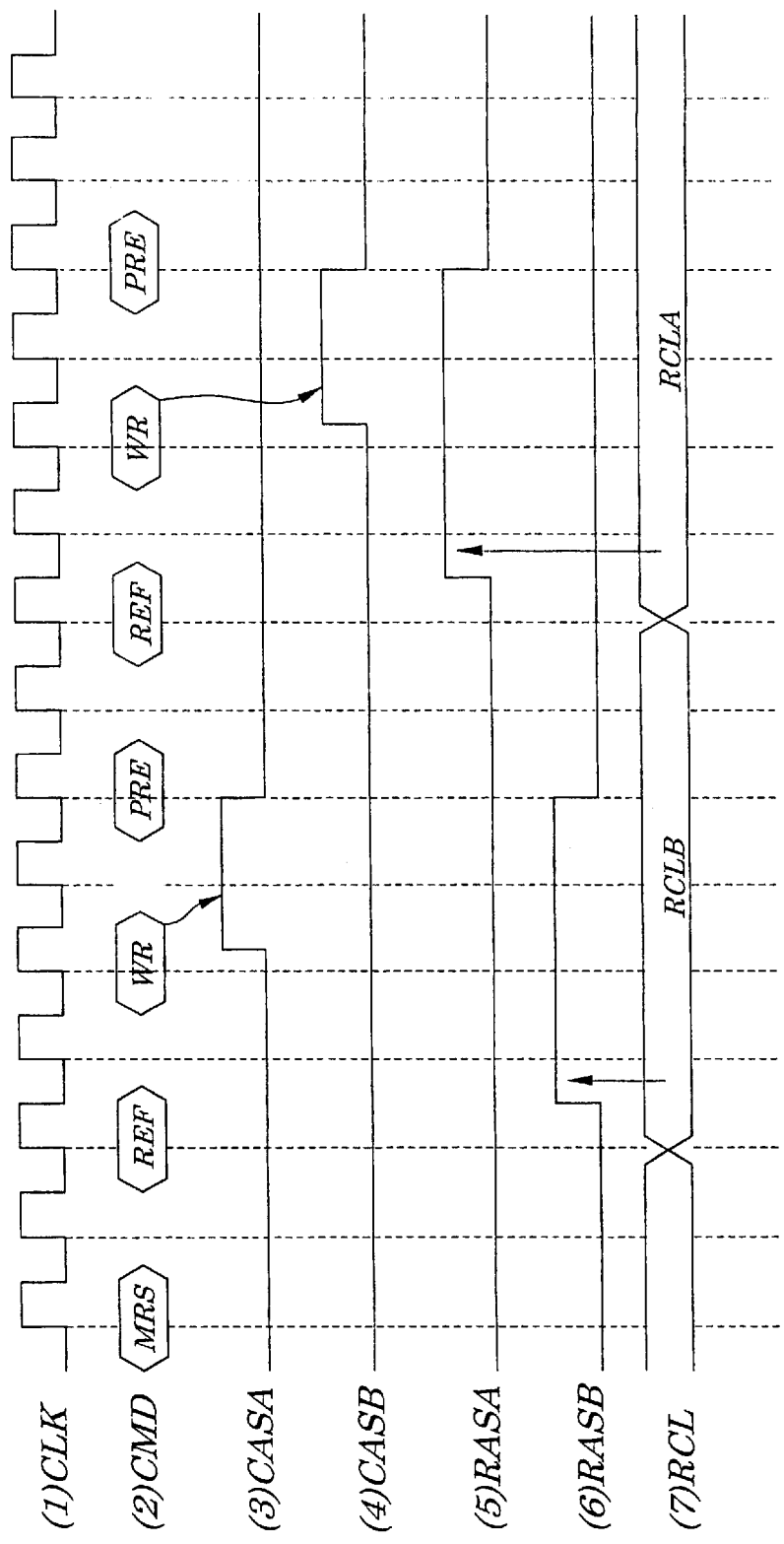
FIG. 14 is a timing chart giving a brief explanation of a conventional refresh counter test.
Figure 15:
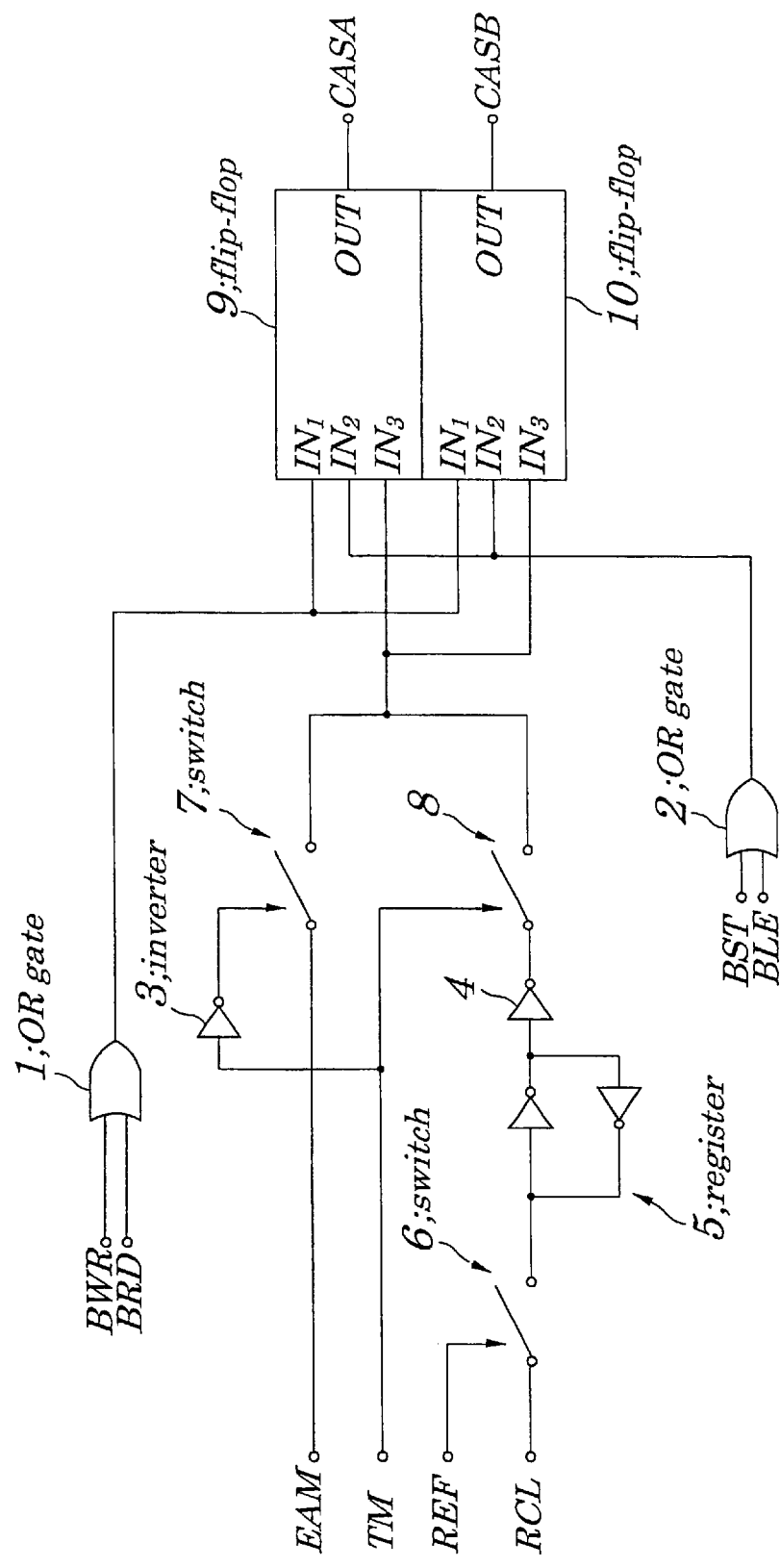
FIG. 15 is a schematic diagram showing electrical configurations of a signal generating circuit of a conventional semiconductor memory device.

Next, a brief explanation of a refresh counter test executed in the semiconductor memory device having configurations described above is given by referring to a timing chart shown in FIG. 13.

First, the command decoder 13 is operated to decode an external command CMD (see (2) in FIG. 13) supplied from outside in synchronization with a clock CLK (see (1) in FIG. 13) and, if the command is a mode register set command MRS, the command is supplied to the test circuit 12. The test circuit 12, in response to the mode register set command MRS supplied from the command decoder 13, is adapted to convert contents stored in a mode register to an operation code to designate a refresh counter test mode obtained by decoding an external address EAD supplied from outside and to feed a test mode signal TM (see (3) in FIG. 13) corresponding to the refresh counter test mode to the row controlling circuit 16 and the column controlling circuit 17.

Since this causes an output signal from the NAND gate 55 of the row controlling circuit 16 to go high, in response to the test mode signal TM and regardless of a supply of the refresh command REF, the switch 71 is turned ON and the switch 70 is turned OFF, as a result (refer to FIG. 6). That is, this puts the row controlling circuit 16 into a state where, if a pre-charge command PRE is supplied, row controlling signals $RCTL_1$ and $RCTL_2$ can be changed from their "H" to "L" level.

Moreover, since, in the column controlling circuit 17, in response to the test mode signal TM, the switch 88 is turned ON and the switches 86 and 87 are turned OFF (refer to FIG. 8), even if the address decoder 14 feeds the most significant 2 bits of an external address EAD supplied from outside, as a bank selecting signal EBS (see (4) in FIG. 13) from outside to the column controlling circuit 17, regardless of the value, a "H" level voltage is applied to each of second input terminals of the NAND gates 89 and 90. Therefore, at the time of executing the refresh counter test, as described later, in the column controlling circuit 17, regardless of the bank selecting signal EBS, the column controlling signals $CCTL_1$ and $CCTL_2$ are produced.

The command decoder 13 is operated to decode an external command CMD (see (2) in FIG. 13) supplied from outside in synchronization with the clock CLK (see (1) in FIG. 13) and, if the command is a refresh command REF, the command is supplied to the address decoder 14 and the row controlling circuit 16. The address decoder 14, in response to the refresh command REF supplied from the command decoder 13, is adapted to feed a counter value RCT supplied from the refresh counter 15, as an internal address IAD, to the banks $11_1$ and $11_2$.

On the other hand, since, in the row controlling circuit 16, in response to the refresh command REF, the switches 68 and 69 are turned ON and the switches 66 and 67 are turned OFF (refer to FIG. 8), even if the address decoder 14 feeds the bank selecting signal EBS (see (4) in FIG. 13) of the address decoder 14 to the row controlling circuit 16, regardless of the value, the column controlling signals $CCTL_1$ and $CCTL_2$ are produced. At this point, as shown in (5) in FIG. 13, since the bit $RCL_1$ of the counter value RCL is supplied from the refresh counter, as shown in (6) in FIG. 13, the row controlling signal $RCTL_1$ goes high. This "H" level row controlling signal $RCTL_1$ is fed to the row decoder $23_1$ and the enable circuit $102_1$. Therefore, since the row decoder $23_1$ is activated in response to the "H" level row controlling signal $RCTL_1$, the "H" level voltage is applied by the row decoder $23_1$ to the word line 34 of the memory cell array $11_1$ designated in accordance with the internal address IAD and the memory cell 33 connected to the word line 34 is refreshed. Operations of the refresh are the same as those in the conventional semiconductor memory device and descriptions of them are omitted accordingly.

Next, the command decoder 13 is operated to decode an external command CMD (see (2) in FIG. 13) supplied from outside in synchronization with the clock CLK (see (1) in FIG. 13) and, if the command is a write command WR, the command is supplied to the column controlling circuit 17. As described above, the switch 88 of the column controlling circuit 17 has been turned ON by the test mode signal TM and a "H" level voltage has been applied to each of second input terminals of the NAND gates 89 and 90. Therefore, by the supply of the write command WR, column controlling signals $CCTL_1$ and $CCTL_2$ outputted from the flip-flops 91 and 92 go high simultaneously (see (8) and (9) in FIG. 13) and the signal $CCTL_1$ is supplied to the enable circuit $102_1$ and the signal $CCTL_2$ to the enable circuit $102_2$. To the enable circuit $102_1$ out of the enable circuits $102_1$ and $102_2$, the "H" level row controlling circuit $RCTL_1$ is supplied and, therefore, the "H" level column controlling signal $CCTL_1$ becomes an enable signal $EN_1$ through the enable circuit $102_1$ and is fed to the column decoder $22_1$. On the other hand, since the row controlling signal $RCTL_2$ supplied to the enable circuit $102_2$ remains high (see (7) in FIG. 13), the enable signal $EN_2$ outputted from the enable circuit $102_2$ remains low (see (11) in FIG. 13). Since the column decoder $22_1$ is activated by the supply of the "H" level enable signal $EN_1$, a "H" level switch signal $SW_1$ (see (12) in FIG. 13) is applied by the column decoder $22_1$ to the switch line 36 of the memory cell array $11_1$ designated in accordance with the internal address IAD and the bit line 35 connected in parallel with the switch line 36 is connected to the input/output line 37. Accordingly, in the memory cell array $21_1$, data supplied from outside is written in a desired memory cell through the selected input/output line 37, column switch 39 and bit line 35. In contrast, in the memory cell array $21_2$, since the column decoder $22_2$ is not activated, no data is written into the memory cell.

Next, the command decoder 13 is operated to decode an external command CMD (see (2) in FIG. 13) supplied from outside in synchronization with the clock CLK (see (1) in FIG. 13) and, if the command is an all-pre-charge command APRE, the all-pre-charge command APRE is supplied to the row controlling circuit 16 and the burst stop command BST is supplied to the column controlling circuit 17. As described above, since the switch 71 of the row controlling circuit 16 has already been turned ON in accordance with the test mode signal TM, by the supply of the pre-charge command PRE, the "H" row controlling signal $RCTL_1$ outputted from the flip-flop 72 becomes low (see (6) in FIG. 13). On the other hand, in the column controlling circuit 17, by the supply of the burst stop command BST, the "H" level column controlling signal $CCTL_1$ and $CCTL_2$ outputted from the flip-flops 91 and 92 become high simultaneously (see (8) and (9) in FIG. 13) and the signal CCTL1 is supplied to the enable circuit $102_1$ and the signal $CCTL_2$ to the enable circuit $102_2$. By the change of the column controlling signal $CCTL_1$ from its "H" to "L" level, the enable signal $EN_1$ changes from its "H" to "L" level and, therefore, the switch signal $SW_1$ changes from its "H" to "L" level (see (12) in FIG. 13).

The operations of refreshing and writing of data in the bank $11_1$ at the time of executing the refresh counter test have been described above. Operations of refreshing and writing of data in the bank $11_2$ (refer to the second half of the timing chart in FIG. 10), of refreshing and reading of data in the bank $11_1$, and of refreshing and reading of data in the bank $11_2$ are the same as those described above and descriptions of them are omitted accordingly.

Thus, according to configurations of this second embodiment, since the enable signal EN is produced in response to the row controlling signal RCTL and the column controlling signal CCTL, with circuit configurations and wiring being simpler than those according to the first embodiment, the refresh counter test can be correctly executed.

It is apparent that the present invention is not limited to the above embodiments but may be changed and modified without departing from the scope and spirit of the invention. For example, in the above descriptions, the present invention is applied to the synchronous DRAM, however, the present invention is not limited to this, i.e., it can be applicable to a non-synchronous DRAM. Moreover, in the above embodiments, the present invention is applied to the DRAM in which two banks are mounted in a transverse direction, however, no limit is placed on the number of banks and the bank may be mounted in a longitudinal direction or in both longitudinal and transverse directions. Furthermore, in the above embodiments, the test circuit 12 constituting the semiconductor memory device is provided with the address decoder, however, the device may be so configured that an address decoded by the address decoder is supplied to the test circuit. Also, though, in the second embodiment of the present invention, for a simplification purpose, the input/output controlling circuits $24_1$ and $24_2$ mounted in the first embodiment are removed and the pre-charge transistors 40 mounted in the memory cell arrays $21_1$ and $21_2$ applied in the first embodiment are removed, instead of the enable circuits $18_1$ and $18_2$ mounted in the first embodiment, the enable circuits $102_1$ and $102_2$ having more simplified configurations may be used, which serves to more reliably prevent malfunctions. Moreover, since the aim of the refresh counter test is to check operations of the refresh counter 15, it is not necessary to refresh all memory cells if a part of the memory cells is refreshed. Furthermore, instead of the flip-flops 72, 73 and 91, R-S flip-flops may be used.

As described above, according to configurations of the present invention, since column decoders of all banks can be activated at the time of executing the refresh counter test, based on the write command or read command supplied after the refresh command has been supplied, the refresh counter test can be correctly executed with simplified circuit configurations and wirings. This enables higher integration of semiconductor memory devices.

Finally, the present application claims the priority of Japanese Patent Application No. Hei11-117223 filed on Apr. 23, 1999, which is herein incorporated by reference.

What is claimed is:

1. A semiconductor memory device comprising:

a plurality of banks, and wherein column decoders of all banks are activated, at a time of executing a refresh counter test, based on a write command or read command supplied after a refresh command has been supplied.

2. The semiconductor memory device according to claim 1, wherein said plurality of banks are mounted in a transverse direction, in a longitudinal direction or in both longitudinal and transverse directions.

3. The semiconductor memory device according to claim 1, wherein said semiconductor memory device is of a synchronous type in which a command, at least, is entered in synchronization with a clock.

4. A semiconductor memory device comprising:

a plurality of word lines, a plurality of bit lines, a plurality of memory cells each being mounted in a matrix form at a point of intersection between each of said word lines and bit lines;

a plurality of input/output lines each being mounted corresponding to each of said bit lines used to input and output data fed from outside to said corresponding memory cell, memory cell arrays each having a plurality of column switches to connect said corresponding bit lines to said corresponding input/output lines;

row decoders to activate any one of said plurality of word lines;

a plurality of banks each having a column decoder to activate any one of said plurality of column switches;

a refresh counter to renew its counter value in accordance with a refresh command;

first controlling means for outputting a first controlling signal to activate any one of said row decoders of said plurality of banks based on renewed counter values every time said refresh command is supplied; and second controlling means for outputting a second controlling signal to activate column decoders of all banks based on a write command or read command supplied after said refresh command has been supplied.

5. The semiconductor memory device according to claim 4, further comprising a third controlling means for outputting a third controlling signal used to activate any one of said column decoders of said plurality of banks based on an output obtained by ANDing said first controlling signal with said second controlling signal.

6. The semiconductor memory device according to claim 4, wherein said memory cell array has a plurality of voltage clamping means for clamping a voltage of each of said input/output lines at a predetermined level and wherein said semiconductor memory device further comprises a fourth controlling means for outputting a fourth controlling signal used to activate each of said plurality of voltage clamping means of banks to which said first controlling signal is not supplied.

7. The semiconductor memory device according to claim 4, wherein said plurality of banks are mounted in a transverse direction, in a longitudinal direction or in both longitudinal and transverse directions.

8. The semiconductor memory device according to claim 4, wherein said semiconductor memory device is of a synchronous type in which a command, at least, is entered in synchronization with a clock.

* * * * *